(12) United States Patent
Chen et al.

(10) Patent No.: US 9,188,859 B2
(45) Date of Patent: *Nov. 17, 2015

(54) POSITIVE PHOTOSENSITIVE RESIN COMPOSITION AND METHOD FOR FORMING PATTERNS BY USING THE SAME

(71) Applicant: CHI MEI CORPORATION, Tainan (TW)

(72) Inventors: Kai-Min Chen, Tainan (TW); Chun-An Shih, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/970,611

(22) Filed: Aug. 20, 2013

(65) Prior Publication Data

US 2014/0065526 A1 Mar. 6, 2014

(30) Foreign Application Priority Data

Aug. 29, 2012 (TW) .............................. 101131364 A

(51) Int. Cl.
G03F 7/023 (2006.01)
G03F 7/038 (2006.01)
C08G 8/24 (2006.01)
G03F 7/022 (2006.01)
G03F 7/20 (2006.01)
G02F 1/136 (2006.01)
H01L 29/786 (2006.01)

(52) U.S. Cl.
CPC ................ *G03F 7/022* (2013.01); *G02F 1/136* (2013.01); *G03F 7/0226* (2013.01); *G03F 7/0236* (2013.01); *G03F 7/20* (2013.01); *H01L 29/786* (2013.01)

(58) Field of Classification Search
CPC ....... G03F 7/0236; G03F 7/38; G03F 7/0226; C08G 8/24
USPC .................. 430/191, 192, 193, 326, 330, 18; 528/155
See application file for complete search history.

(56) References Cited

U.S. PATENT DOCUMENTS

| 5,945,516 | A | * | 8/1999 | Sandford et al. ............... 534/557 |
| 6,929,890 | B2 | * | 8/2005 | Miyoshi ................ G03F 7/0007 |
| | | | | 430/191 |
| 7,638,253 | B2 | * | 12/2009 | Park et al. ...................... 430/170 |
| 8,921,019 | B2 | * | 12/2014 | Kwon et al. ..................... 430/18 |
| 2013/0164461 | A1 | * | 6/2013 | Chen et al. ...................... 428/1.6 |
| 2013/0306970 | A1 | * | 11/2013 | Chen et al. ....................... 257/57 |

FOREIGN PATENT DOCUMENTS

| JP | 11-143067 | 5/1999 |
| TW | 200811594 | 3/2008 |
| TW | 201216003 A1 | 4/2012 |

* cited by examiner

*Primary Examiner* — John S Chu
(74) *Attorney, Agent, or Firm* — CKC & Partners Co., Ltd.

(57) ABSTRACT

The present invention relates to a positive photosensitive resin composition and a method for forming patterns by using the same. The positive photosensitive resin composition includes a novolac resin (A), an ortho-naphthoquinone diazide sulfonic acid ester (B), a dye (C) and a solvent (D). The novolac resin (A) further includes hydroxy-type novolac resin (A-1), which is synthesized by condensing hydroxylbenzaldehyde compound with aromatic hydroxyl compound. The dye (C) includes at least one (C-1) selected from the group consisting of diazo dye, anthraquinone dye and chromium (III, $Cr^{3+}$) azo dye, as well as triarylmethane dye (C-2). Since the positive photosensitive resin composition can form colorfully fine patterns on metal circuits, and such patterns are not decolored after being etched, thereby beneficially blocking the reflected light of the metal circuits.

16 Claims, 1 Drawing Sheet

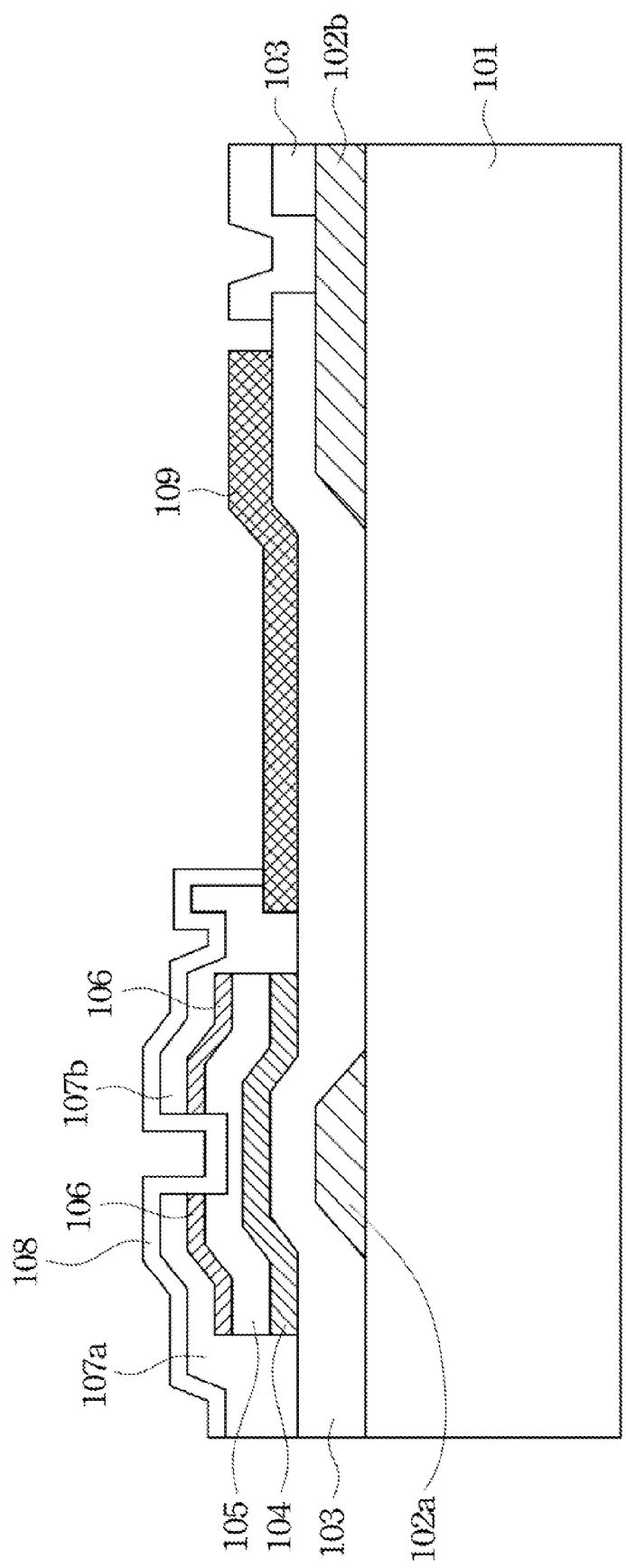

POSITIVE PHOTOSENSITIVE RESIN COMPOSITION AND METHOD FOR FORMING PATTERNS BY USING THE SAME

RELATED APPLICATIONS

This application claims priority to Taiwan Application Serial Number 101131364, filed on Aug. 29, 2012 which is herein incorporated by reference.

BACKGROUND

1. Field of Invention

The present invention relates to a positive photosensitive resin composition and a method for forming patterns by using the same. More particularly, the present invention relates to a positive photosensitive resin composition for forming colorfully fine patterns on metal circuits, wherein such patterns are not decolored after being etched, thereby beneficially blocking the reflected light of the metal circuits during a manufacturing process of a semiconductor integrated circuit device, a thin film transistor-liquid crystal display (TFT-LCD) device or a touch panel.

2. Description of Related Art

Depending upon the microminiaturization of various electronic products in daily life, the demand for high resolution in various smart phones, slim TVs and microprocessors with high-performance is increased gradually, so that a more accurate representation of the light lithography process is required to form patterns with finer line width.

For the aforementioned purposes, a positive photosensitive resin composition disclosed in the Japanese Patent Laid-open publication No. H11-143067 includes a novolac resin, a dye for absorbing ultraviolet light, a photoacid generator and a bridging agent catalyzed by acids. During synthesis of the novolac resin in this Japanese Patent Laid-open publication, a deuterium (D)-substituted dimethyl sulfoxide solution is used, to improve the photosensiblity and chemical resistance of the positive photosensitive resin composition.

However, in the prior art, after the metal circuits are etched, it is often found problems that the photoresist patterns adhered on the metal circuits are decolored easily or insufficient to light shielding rate, which cause that the photoresist layer cannot block the reflected light of the metal circuits. Particularly, in a process of a semiconductor integrated circuit device, a thin film transistor-liquid crystal display (TFT-LCD) device or a touch panel, if the photoresist patterns are decolored easily or insufficient to light shielding rate, the photoresist layer cannot block the reflected light of the metal circuits, thereby reducing the resolution of the subsequent lithography process. Therefore, it is important how to prevent the etched patterns formed by the positive photosensitive resin composition from being decolored.

Accordingly, it is desired to provide a positive photosensitive resin composition material for forming patterns that are not decolored after being etched, so as to overcome the aforementioned problems of the prior art.

SUMMARY

Therefore, an aspect of the present invention provides a positive photosensitive resin composition, which includes a novolac resin (A), an ortho-naphthoquinone diazide sulfonic acid ester (B), a dye (C) and a solvent (D). The above-mentioned novolac resin (A) includes hydroxy-type novolac resin (A-1), which is synthesized by condensing hydroxyl benzaldehyde compound with aromatic hydroxyl compound. The above-mentioned dye (C) includes at least one (C-1) selected from the group consisting of diazo dye, anthraquinone dye and chromium (III, $Cr^{3+}$) azo dye, as well as triarylmethane dye (C-2).

Another aspect of the present invention provides a method for forming patterns which subjects the above-mentioned positive photosensitive resin composition into a prebake step, an exposure step, a development step and a postbake step, so as to form patterns on a substrate. Since the above-mentioned positive photosensitive resin composition can be formed to colorfully fine patterns on metal circuits, such patterns are not decolored after being etched (or called as post-etch decolored), thereby beneficially blocking the reflected light of the metal circuits.

Still another aspect of the present invention provides a thin-film transistor (TFT) array substrate, which includes the above-mentioned patterns.

Yet still another aspect of the present invention provides a liquid crystal display (LCD) device, which includes the above-mentioned TFT array substrate.

The positive photosensitive resin composition, the structures of the TFT array substrate and the LCD device and the method of forming patters of the present invention are respectively described below.

Positive Photosensitive Resin Composition

The positive photosensitive resin composition of the present invention includes a novolac resin (A), an ortho-naphthoquinone diazide sulfonic add ester (B), a dye (C) and a solvent (D), which are respectively described below.

Novolac Resin (A)

The novolac resin (A) of the positive photosensitive resin composition of the present invention includes hydroxy-type novolac resin (A-1), and optionally further include other novolac resin (A-2).

The above-mentioned hydroxy-type novolac resin (A-1) is synthesized by condensing hydroxyl benzaldehyde compound with aromatic hydroxyl compound in the presence of acid catalyst.

The specific examples of the above-mentioned hydroxyl benzaldehyde compound include: hydroxyl benzaldehyde compound such as o-hydroxyl benzaldehyde, m-hydroxyl benzaldehyde, p-hydroxyl benzaldehyde and the like; dihydroxyl benzaldehyde compound such as 2,3-dihydroxyl benzaldehyde, 2,4-dihydroxyl benzaldehyde, 2,5-dihydroxyl benzaldehyde, 3,4-dihydroxyl benzaldehyde, 3,5-dihydroxyl benzaldehyde and the like; trihydroxyl benzaldehyde compound such as 2,3,4-trihydroxyl benzaldehyde, 2,4,5-trihydroxyl benzaldehyde, 2,4,6-trihydroxyl benzaldehyde, 3,4,5-trihydroxyl benzaldehyde and the like; and hydroxyl alkyl benzaldehyde compound such as o-hydroxymethyl benzaldehyde, m-hydroxymethyl benzaldehyde, p-hydroxymethyl benzaldehyde and the like. The hydroxyl benzaldehyde compound can be used alone or in combinations of two or more. Among those hydroxyl benzaldehyde compounds, o-hydroxyl benzaldehyde, m-hydroxyl benzaldehyde, p-hydroxyl benzaldehyde, 2,3-dihydroxyl benzaldehyde, 2,4-dihydroxyl benzaldehyde, 3,4-dihydroxyl benzaldehyde, 2,3,4-trihydroxyl benzaldehyde and o-hydroxylmethyl benzaldehyde are preferred.

Moreover, the specific examples of the aromatic hydroxyl compound that can be condensed with the above-mentioned hydroxyl benzaldehyde compound include: phenol; cresols such as m-cresol, p-cresol and o-cresol; xylenols such as 2,3-xylenol, 2,5-xylenol, 3,5-xylenol, 3,4-xylenol and the like; alkyl phenols such as methyl phenol, p-ethyl phenol, o-ethyl phenol, 2,3,5-trimethylphenol, 2,3,5-triethylphenol, 4-tert-butyl phenol, 3-tert-butyl phenol, 2-tert-butyl phenol, 2-tert-butyl-4-methylphenol, 2-tert-butyl-5-methylphenol, 6-tert-butyl-3-methylphenol and the like; alkoxy phenols such as p-methoxy phenol, m-methoxy phenol, p-ethyoxyl phenol, m-ethyoxyl phenol, p-propoxy phenol, m-propoxy phenol and the like; isopropenyl phenols such as o-isopropenyl phenol, p-isopropenyl phenol, 2-methyl-4-isopropenyl phenol, 2-ethyl-4-isopropenyl phenol and the like; aryl phenols such as phenyl phenol; polyhydroxyphenols such as 4,4'-dihydroxybiphenyl, bisphenol A, resorcinol, hydroquinone, 1,2,3-pyrogallol and the like. The above-mentioned aromatic hydroxyl compound can be used alone or in combinations of two or more. Among those aromatic hydroxyl compounds, o-cresol, m-cresol, p-cresol, 2,5-xylenol, 3,5-xylenol, 2,3,5-trimethylphenol and the like are preferred.

Specific examples of the above-mentioned acid catalyst include hydrochloric acid, sulfuric acid, formic acid, acetic acid, oxalic acid and p-toluenesulfonic acid and the like.

Based on an amount of the novolac resin (A) as 100 parts by weight, the amount of the hydroxy-type novolac resin (A-1) is generally 30 to 100 parts by weight, preferred 40 to 100 parts by weight, more preferred 50 to 100 parts by weight. When 30 to 100 parts by weight of the hydroxy-type novolac resin (A-1) is 30 to 100 parts by weight used in the positive photosensitive resin composition, the resulted pattern has a better residual film rate. However, when the hydroxy-type novolac resin (A-1) is not used in the positive photosensitive resin composition, the resulted colorfully fine patterns have problems such as decolorization and poor resolution after being etched.

As for other novolac resin (A-2), it is generally synthesized by condensing the above-mentioned aromatic hydroxyl compound with aldehyde of non-hydroxyl benzaldehyde in the presence of the above-mentioned acid catalyst.

Specific examples of the above-mentioned aldehyde of non-hydroxyl benzaldehyde include: formaldehyde, paraformaldehyde, trioxane, acetaldehyde, propionaldehyde, butyraldehyde, trimethylacetaldehyde, acrolein, crotonaldehyde, cyclo hexanealdehyde, furfural, furylacrolein, benzaldehyde, terephthal aldehyde, phenylacetaldehyde, α-phenylpropyl aldehyde, β-phenylpropyl aldehyde, o-methyl benzaldehyde, m-methyl benzaldehyde, p-methyl benzaldehyde, o-chlorobenzaldehyde, m-chlorobenzaldehyde, p-chlorobenzaldehyde and cinnamaldehyde and the like. The above-mentioned aldehyde can be used alone or in combinations of two or more. Among those aldehydes of non-hydroxyl benzaldehyde, methanal and benzaldehyde are preferred.

The above-mentioned hydroxy-type novolac resin (A-1) or other novolac resin (A-2) can be selected from a single kind of novolac resin or a mixture of two or more kinds of novolac resins.

Ortho-Naphthoquinone Diazide Sulfonic Acid Ester (B)

The ortho-naphthoquinone diazide sulfonic acid ester (B) of the present invention can be selected from the conventionally common ones without any specific limitation. In preferred examples of the present invention, the above-mentioned ortho-naphthoquinone diazide sulfonic acid ester (B) can include but not limited to: esters of ortho-naphthoquinone diazide sulfonic acid and a hydroxyl compound such as ortho-naphthoquinone diazide-4-sulfonic acid, ortho-naphthoquinone diazide-5-sulfonic acid and ortho-naphthoquinone diazide-6-sulfonic acid. However, the above-mentioned ester of the ortho-naphthoquinone diazide sulfonic acid and a polyhydroxyl compound is preferred. The above-mentioned ortho-naphthoquinone diazide sulfonic acid ester (B) can be esterified completely or partially. The kinds of the above-mentioned hydroxyl compound can be exemplified as: (1) hydroxybenzopheones, (2) hydroxyl aryl compounds of Formula (XIII), (3) (hydroxyl phenyl)hydrocarbon compounds of Formula (XIV) and (4) other aromatic hydroxyl compound, which are respectively described below.

(1) Specific examples of the hydroxybenzophenone include: 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone or 2,3,3',4,4',5'-hexahydroxybenzophenone.

(2) Specific examples of the hydroxyl aryl compound have a structure as shown in Formula (XIII):

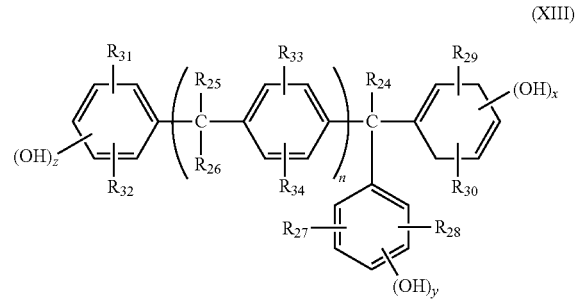

(XIII)

In Formula (XIII), $R_{24}$ to $R_{26}$ each independently represents a hydrogen atom or a lower alkyl group; $R_{27}$-$R_{32}$ each independently represents a hydrogen atom, a halogen atom, a lower alkyl group, a lower alkoxy group, a lower alkenyl group or a cycloalkyl group; $R_{33}$ and $R_{34}$ each independently represents a hydrogen atom, a halogen atom or a lower alkyl group; x, y and z each independently represents a integer of 1 to 3; and n is 0 or 1.

In preferred examples of the present invention, the hydroxyl aryl compound with a structure shown in Formula (XIII) is tris(4-hydroxylphenyl) methane, bi(4-hydroxyl-3,5-dimethylphenyl)-4-hydroxyl phenyl methane, bi(4-hydroxyl-3,5-dimethyl phenyl)-3-hydroxyl phenyl methane, bi(4-hydroxyl-3,5-dimethylphenyl)-2-hydroxylphenyl methane, bi(4-hydroxyl-2,5-dimethylphenyl)-4-hydroxylphenyl methane, bi(4-hydroxyl-2,5-dimethylphenyl)-3-hydroxylphenyl methane, bi(4-hydroxyl-2,5-dimethylphenyl)-2-hydroxylphenyl methane, bi(4-hydroxyl-3,5-dimethylphenyl)-3,4-dihydroxylphenyl methane, bi(4-hydroxyl-2,5-dimethylphenyl)-3,4-dihydroxylphenyl methane, bi(4-hydroxyl-3,5-dimethylphenyl)-2,4-dihydroxylphenyl methane, bi(4-hydroxyl-2,5-dimethylphenyl)-2,4-dihydroxylphenyl methane, bi(4-hydroxyl phenyl)-3-methoxyl-4-hydroxylphenyl methane, bi(3-cyclohexyl-4-hydroxylphenyl)-3-hydroxylphenyl methane, bi(3-cyclohexyl-4-hydroxylphenyl)-2-hydroxylphenyl methane, bi(3-cyclohexyl-4-hydroxylphenyl)-4-hydroxylphenyl methane, bi(3-cyclohexyl-4-hydroxyl-6-methylphenyl)-2-hydroxylphenyl methane, bi(3-cyclohexyl-4-hydroxyl-6-methylphenyl)-3-hydroxylphenyl methane, bi(3-cyclohexyl-4-hydroxyl-6-methylphenyl)-4-hydroxylphenyl methane, bi(3-cyclohexyl-4-hydroxyl-6-methylphenyl)-3,4-dihydroxylphenyl methane, bi(3-cyclohexyl-6-hydroxylphenyl)-3-hydroxylphenyl methane, bi(3-cyclohexyl-6-hydroxylphenyl)-4-hydroxylphenyl methane, bi(3-cyclohexyl-6- hydroxylphenyl)-2-hydroxylphenyl methane, bi(3-cyclohexyl-6-hydroxyl-4-methylphenyl)-2-hydroxylphenyl methane, bi(3-cyclohexyl-6-hydroxyl-4-methylphenyl)-4-hydroxylphenyl methane, bi(3-cyclohexyl-6-hydroxyl-4-methylphenyl)-3,4-dihydroxylphenyl methane, 1-[1-(4-hydroxylphenyl)isopropyl]-4-[1,1-bi(4-hydroxylphenyl)ethyl]benzene or 1-[1-(3-methyl-4-hydroxylphenyl)isopropyl]-4-[1,1-bi(3-methyl-4-hydroxylphenyl)ethyl]benzene.

(3) Specific examples of the (hydroxylphenyl)hydrocarbon compound have a structure as shown in Formula (XIV) as follows:

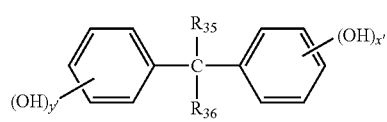

(XIV)

In Formula (XIV), $R_{35}$ and $R_{36}$ each independently represents a hydrogen atom or a lower alkyl; group and x' and y' each independently represents an integer of 1 to 3.

In preferred examples of the present invention, the (hydroxyl phenyl) hydrocarbon compound with a structure as shown in Formula (XIV) is: 2-(2,3,4-trihydroxylphenyl)-2-(2',3',4'-trihydroxylphenyl)propane, 2-(2,4-dihydroxylphenyl)-2-(2',4'-dihydroxylphenyl)propane, 2-(4-hydroxylphenyl)-2-(4'-hydroxylphenyl)propane, bi(2,3,4-trihydroxyl phenyl)methane or bi(2,4-dihydroxylphenyl)methane.

(4) Specific examples of other aromatic hydroxyl compound are: phenol, p-metoxyphenol, xylenol, hydroquinone, bisphenol A, naphthol, pyrocatechol, 1,2,3-pyrogallol monomethyl ether, 1,2,3-pyrogallol-1,3-dimethyl ether, 3,4,5-gallic acid or 3,4,5-gallic acid that is esterified or etherified partially.

Among those hydroxyl compounds, 2,3,4-trihydroxybenzophenone or 2,3,4,4'-tetrahydroxybenzophenone is preferred. The above-mentioned hydroxyl compound can be used alone or in combinations of two or more.

A compound including quinone diazide can be used as the ortho-naphthoquinone diazide sulfonic acid ester (B) in the positive photosensitive resin composition of the present invention, for example, the compound which is esterified completely or partially through the condensation reaction of the ortho-naphthoquinone diazide-4(or 5)-sulfonyl halides and the above-mentioned (1) to (4) hydroxyl compounds. The above-mentioned condensation reaction is generally performed in organic solvents such as dioxane, N-pyrrolidone, acetamide and the like, and preferably in the presence of alkaline condensing agents such as triethanolamine, alkali carbonate or alkali bicarbonate.

In preferred examples of the present invention, based on the total amount of the hydroxyl groups in the hydroxyl compound as 100 mole %, preferably more than 50 mole %, and more preferably more than 60 mole % of the hydroxyl groups and the ortho-naphthoquinone diazide-4(or 5)-sulfonyl halides both of which are condensed to the ester having an esterification degree of more than 50% and preferably more than 60%.

In a specific example of the present invention, based on the amount of the novolac resin (A) as 100 parts by weight, an amount of the ortho-naphthoquinone diazide sulfonic acid ester (B) of the present invention is generally 5 to 50 parts by weight, preferably 10 to 40 parts by weight, more preferably 20 to 30 parts by weight.

Dye (C)

The dye (C) of the present invention includes at least one (C-1) selected from the group consisting of diazo dye, anthraquinone dye and chromium (III, $Cr^{3+}$) azo dye, as well as triarylmethane dye (C-2).

The above-mentioned diazo dye can be the ones used by those of skills in the art and many commercially available diazo dyes, for example, C.I. Acid Black 1, C.I. Acid Black 24, C.I. Reactive Black 5, C.I. Solvent Black 3 (trade name of Sudan Black 141 manufactured by Nippon Synthetic Chemical Industry Co., Ltd.; trade name of Neptun Black X60 manufactured by BASF), trade name of Oil Black DA-411 (manufactured by NEMOTO & CO., LTD.) and the like.

The above-mentioned anthraquinone dye can be the ones used by those of skills in the art and many commercially available anthraquinone dyes, for example, C.I. Solvent Red 52, C.I. Solvent Red 111, C.I. Solvent Red 149, C.I. Solvent Red 150, C.I. Solvent Red 151, C.I. Solvent Red 168, C.I. Solvent Red 191, C.I. Solvent Red 207, C.I. Solvent Blue 35, C.I. Solvent Blue 36, C.I. Solvent Blue 63, C.I. Solvent Blue 78, C.I. Solvent Blue 83, C.I. Solvent Blue 87, C.I. Solvent Blue 94, C.I. Solvent Blue 97, C.I. Solvent Blue 101, C.I. Solvent Green 3, C.I. Solvent Green 20, C.I. Solvent Green 28, C.I. Solvent Violet 13, C.I. Solvent Violet 14, C.I. Solvent Violet 36, C.I. Disperse Red 22, C.I. Disperse Red 60, C.I. Disperse Violet 31, C.I. Disperse Violet 28, C.I. Vat Black 27, trade name of Kayaset Black A-N (manufactured by Nippon Kayaku Co., Ltd.) and the like.

The above-mentioned chromium (III, $Cr^{3+}$) azo dye can be the ones used by those of skills in the art and many commercially available chromium (III, $Cr^{3+}$) azo dyes, for example, C.I. Solvent Black 27 (trade name of Neozapon Black X51, manufactured by BASF; trade name of Van CHAKU Black Z1-1500, manufactured by Gen Gen Corporation), C.I. Solvent Black 29 (trade name of VALIFAST BLACK 3808, manufactured by ORIENT CHEMICALS), C.I. Solvent Black 34 (trade name of VALIFAST BLACK 3804, manufactured by ORIENT CHEMICALS) and the like.

The above-mentioned at least one (C-1) selected from the group consisting of diazo dye, anthraquinone dye and chromium (III, $Cr^{3+}$) azo dye can be used alone or in combinations of two or more.

Moreover, the above-mentioned triarylmethane dye (C-2) includes the structure shown in Formula (I) or Formula (II) or salts thereof. The salts of the structure shown in Formula (I) or Formula (II) can be, for example, alkali metal salts such as sodium, potassium and so on; or amine salts such as triethylamine, 2-ethylhexyl amine and 1-amido-3-phenyl butane. Those salts also can be sulfite ($—SO^{3-}$) salts.

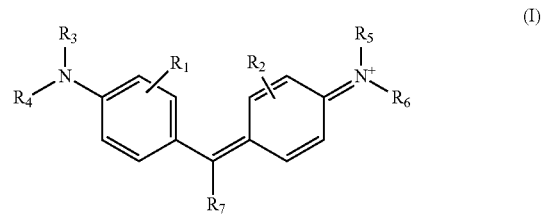

(I)

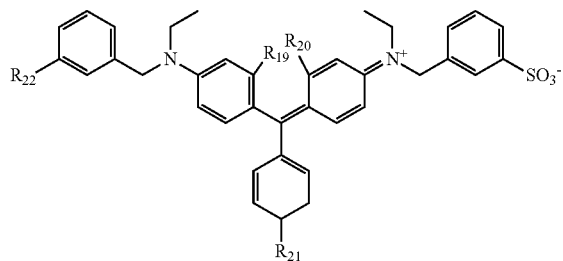

In Formula (I), $R_1$ and $R_2$ each is independently selected from the group consisting of a hydrogen atom, a halogen atom and a $C_1$ to $C_5$ alkyl group; $R_3$, $R_4$, $R_5$ and $R_6$ each is independently selected from the group consisting of a hydrogen atom, a $C_1$ to $C_5$ alkyl, phenyl and benzyl group; and $R_7$ is a structure selected from the group consisting of Formula (III), Formula (IV) and Formula (V).

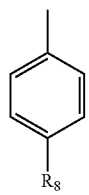

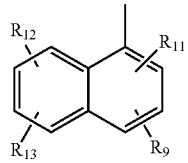

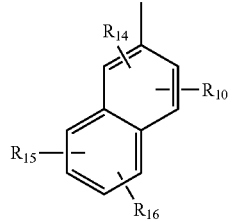

In the Formula (III), the Formula (IV) and the Formula (V), $R_8$ to $R_{10}$ each is selected from the group consisting of a hydrogen atom and —$NR_{17}R_{18}$; $R_{17}$ and $R_{18}$ each is independently selected from the group consisting of a hydrogen atom, a $C_1$ to $C_5$ alkyl group, benzyl, phenyl group and a phenyl group that comprises a $C_1$ to $C_3$ alkyl group or a $C_1$ to $C_3$ alkoxyl group substituted at a p position thereof; and $R_{11}$ to $R_{16}$ each is independently selected from the group consisting of a hydrogen atom, a hydroxyl group and —$SO^{3-}$.

In Formula (II), $R_{19}$ and $R_{20}$ each is independently selected from the group consisting of a hydrogen atom, a halogen atom and a $C_1$ to $C_5$ alkyl group; $R_{21}$ is selected from the group consisting of a hydrogen atom, —$SO^{3-}$, a carboxyl group, a $C_1$ to $C_3$ alkyl group, a $C_1$ to $C_3$ alkoxyl group and —$NR_{17}R_{18}$; and $R_{22}$ is selected from the group consisting of a hydrogen atom and —$SO^{3-}$.

Preferably, the $C_1$ to $C_3$ alkyl group of the above-mentioned $R_8$, $R_{19}$, $R_{20}$, $R_{21}$, $R_{17}$ and $R_{18}$ is methoxy, ethyoxyl or propoxy group; a $C_1$ to $C_3$ alkoxy group of $R_8$ and $R_{21}$ is methoxyl, ethyoxyl or propoxy group; and the phenyl group comprising the $C_1$ to $C_3$ alkoxyl group substituted at a p position thereof of $R_{17}$ and $R_{18}$ is p-methoxyphenyl, p-ethoxyphenyl or p-propoxyphenyl group.

There are many commercial dyes available for the triarylmethane dye (C-2) of the present invention, for example, C.I. Acid Green 3, C.I. Acid Green 9, C.I. Acid Green 16, C.I. Acid Green 50, C.I. Acid Blue 7, C.I. Acid Blue 83 (trade name of Brilliant Blue R; manufactured by Trust Chem), C.I. Acid Blue 90, C.I. Acid Blue 108, C.I. Acid Violet 17 (trade name of Coomassie Violet R200; manufactured by Sigma), C.I. Acid Violet 49, C.I. Solvent Green 15, C.I. Solvent Violet 8, C.I. Basic Blue 1, C.I. Basic Blue 5, C.I. Basic Blue 7 (trade name of Basonyl Blau 636; manufactured by BASF), C.I. Basic Blue 8, C.I. Basic Blue 26, C.I. Solvent Blue 5, C.I. Solvent Blue 38, C.I. Basic Green 1, C.I. Basic Red 9, C.I. Basic Violet 3, C.I. Basic Violet 12, C.I. Basic Violet 14, Methyl Violet, Crystal Violet, Victoria Blue B, Oil Blue 613 (manufactured by ORIENT CHEMICALS), VALIFAST Blue 1621 (manufactured by ORIENT CHEMICALS), SBN Blue 701 (manufactured by Hodogaya Chemical Group), derivatives thereof and the like. The above-mentioned triarylmethane dye (C-2) can be used alone or in combinations of two or more.

Based on the amount of the novolac resin (A) as 100 parts by weight, an amount of the at least one (C-1) selected from the group consisting of the diazo dye, the anthraquinone dye and the chromium (III, $Cr^{3+}$) azo dye is 2 parts by weight to 30 parts by weight, preferably 3 parts by weight to 15 parts by weight, and more preferably 5 parts by weight to 10 parts by weight; an amount of the triarylmethane dye (C-2) is 1 part by weight to 10 parts by weight, preferably 2 parts by weight to 9 parts by weight, and more preferably 3 parts by weight to 8 parts by weight. When there is neither the at least one (C-1) selected from the group consisting of the diazo dye nor the anthraquinone dye and the chromium (III, $Cr^{3+}$) azo dye, or the triarylmethane dye (C-2) in the positive photosensitive resin composition, the pattern formed subsequently by such composition may have the problems such as bad resolution, insufficient film-remaining ratio and the like.

Moreover, the weight ratio [(C-1)/(C-2)] of the amount of the at least one (C-1) selected from the group consisting of the diazo dye, the anthraquinone dye and the chromium (III, $Cr^{3+}$) azo dye to the amount of the triarylmethane dye (C-2) is 1 to 10, preferably 2 to 9, and more preferably 3 to 7. When the weight ratio [(C-1)/(C-2)] of the amount of the at least one (C-1) selected from the group consisting of the diazo dye, the anthraquinone dye and the chromium (III, $Cr^{3+}$) azo dye to the amount of the triarylmethane dye (C-2) is between 1 and 10, the pattern formed by such composition is not easily decolored after being etched.

Moreover, the dye (C) of the present invention further includes a phthalocyanine dye (C-3), which has a structure represented by Formula (VI):

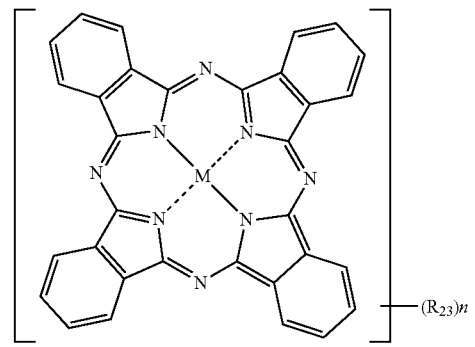

In the Formula (VI), $R_{23}$ is a substituent, and preferably $R_{a1}$ to $R_{a8}$ and $R_{b1}$ to $R_{b8}$ shown in the following Formula (VII).

In the Formula (VI), n is an integer of 1 to 8, preferably 1 to 6, and more preferably 1 to 4. When n is an integer of more than 2, many existing $R_{23}$ may be the same or different.

In the Formula (VI), M is selected from the group consisting of metal, metal chloride, metal oxide and metal hydroxide. Preferably, the metal suitable for M is selected from the group consisting of zinc, magnesium, silicon, tin, rhodium, platinum, palladium, molybdenum, manganese, lead, copper, nickel, cobalt and iron. The metal chloride suitable for M is selected from the group consisting of AlCl, InCl, FeCl, $TiCl_2$, $SnCl_2$, $SiCl_2$ and $GeCl_2$. The metal oxide used in M is selected from the group consisting of TiO and VO. The metal hydroxide used in M is $Si(OH)_2$. Preferably, M is selected from the group consisting of zinc, palladium, copper, nickel, cobalt and VO, more preferably being selected from the group consisting of zinc, copper, cobalt and VO, and much more preferably copper.

Furthermore, the above phthalocyanine dye (C-3) preferably has a structure of the following Formula (VII):

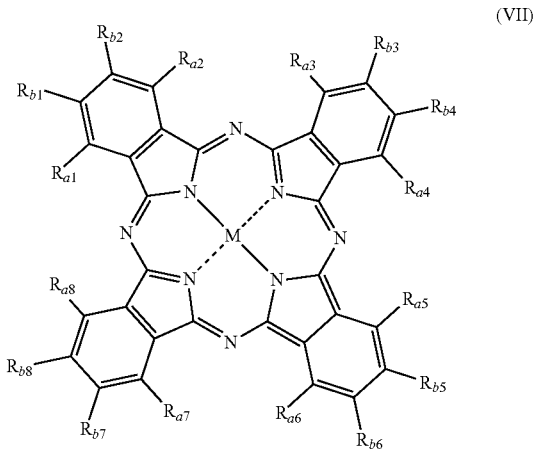

(VII)

Wherein, $R_{a1}$ to $R_{a8}$ and $R_{b1}$ to $R_{b8}$ in the above Formula (VII) each independently is selected from the group consisting of a hydrogen atom, a halogen atom, a cyano group, a nitro group, a formyl group, a carboxyl group, a sulfo group, an unsubstituted or substituted $C_1$ to $C_{20}$ alkyl group, an unsubstituted or substituted $C_6$ to $C_{24}$ aryl group, an unsubstituted or substituted $C_1$ to $C_{10}$ heterocyclic group, an unsubstituted or substituted $C_1$ to $C_{20}$ alkoxy group, an unsubstituted or substituted $C_6$ to $C_{14}$ aryloxy group, an unsubstituted or substituted acetyl $C_2$ to $C_{21}$ group, an unsubstituted or substituted $C_1$ to $C_{20}$ alkylsulfonyl group, an unsubstituted or substituted $C_6$ to $C_{14}$ arylsulfonyl group, an unsubstituted or substituted $C_1$ to $C_{10}$ heterocyclic sulfonyl group, an unsubstituted or substituted $C_1$ to $C_{25}$ carbamoyl group, an unsubstituted or substituted $C_0$ to $C_{32}$ sulfamoyl group, an unsubstituted or substituted $C_2$ to $C_{20}$ alkoxycarbonyl group, an unsubstituted or substituted $C_7$ to $C_{15}$ aryloxycarbonyl group, an unsubstituted or substituted $C_2$ to $C_{21}$ amide group, an unsubstituted or substituted $C_1$ to $C_{20}$ sulfonylamino group and an unsubstituted or substituted $C_0$ to $C_{36}$ amine group, and in which the above-mentioned amine group includes an aniline group. Additionally, for achieving better mutual solubility with solvents, $R_{a1}$ to $R_{a8}$ and $R_{b1}$ to $R_{b8}$ preferably have at least eight hydrogen atoms, but not all of $R_{a1}$ to $R_{a8}$ represent hydrogen atoms.

Preferably, $R_{a1}$ to $R_{a8}$ and $R_{b1}$ to $R_{b8}$ are independently selected from the group consisting of a hydrogen atom, a halogen atom, a carboxyl, sulfo, an unsubstituted or substituted $C_1$ to $C_{16}$ alkyl (for example, methyl, ethyl, n-propyl, isopropyl) group, an unsubstituted or substituted $C_6$ to $C_{24}$ aryl (for example, phenyl, p-methoxyphenyl, p-octadecylphenyl) group, an unsubstituted or substituted $C_1$ to $C_{16}$ alkoxy (for example, methoxy, oxyethyl, n-octyloxy) group, an unsubstituted or substituted $C_6$ to $C_{10}$ aryloxy (for example, phenoxy, p-ethoxy phenoxy) group, an unsubstituted or substituted $C_1$ to $C_{20}$ alkylsulfonyl (for example, methylsulfonyl, n-propyl sulfonyl, n-octyl sulfonyl) group, an unsubstituted or substituted $C_6$ to $C_{14}$ arylsulfonyl (for example, toluenesulfonyl, benzenesulfonyl) group, an unsubstituted or substituted $C_0$ to $C_{20}$ sulfamoyl (for example, methyl sulfamoyl, n-butyl sulfamoyl) group, an unsubstituted or substituted $C_1$ to $C_{17}$ alkoxycarbonyl (for example, methoxycarbonyl, n-butoxycarbonyl) group, an unsubstituted or substituted $C_7$ to $C_{15}$ aryloxycarbonyl (for example, benzeneoxycarbonyl) group, an unsubstituted or substituted $C_2$ to $C_{21}$ amide (for example, acetamino, trimethyl acetamino) group and an unsubstituted or substituted $C_1$ to $C_{18}$ sulfonylamino (for example, methylsulfonylamino, n-butanylsulfonylamino) group.

More preferably, $R_{a1}$ to $R_{a8}$ and $R_{b1}$ to $R_{b8}$ are independently selected from the group consisting of a hydrogen atom, a halogen atom, a carboxyl, sulfo, an unsubstituted or substituted $C_1$ to $C_{16}$ alkyl group, an unsubstituted or substituted $C_1$ to $C_{16}$ alkoxy group, an unsubstituted or substituted $C_1$ to $C_{20}$ alkylsulfonyl group, an unsubstituted or substituted $C_6$ to $C_{14}$ arylsulfonyl group, an unsubstituted or substituted $C_2$ to $C_{20}$ sulfamoyl group, a $C_1$ to $C_{13}$ alkoxycarbonyl group, an unsubstituted or substituted $C_2$ to $C_{21}$ amide group and a $C_1$ to $C_{18}$ sulfonylamino group.

Especially more preferably, $R_{a1}$ to $R_{a8}$ each is independently selected from the group consisting of a hydrogen atom, a halogen atom, a sulfo group, an unsubstituted or substituted $C_1$ to $C_{16}$ alkoxy group, an unsubstituted or substituted $C_1$ to $C_{20}$ alkylsulfonyl group, an unsubstituted or substituted $C_6$ to $C_{14}$ arylsulfonyl group, an unsubstituted or substituted $C_2$ to $C_{20}$ sulfamoyl group, an unsubstituted or substituted $C_2$ to $C_{21}$ amide group and a $C_1$ to $C_{18}$ sulfonylamino group, and $R_{b1}$ to $R_{b8}$ each independently represents a hydrogen atom or a halogen atom.

Even more preferably, $R_{a1}$ to $R_{a8}$ each is independently selected from the group consisting of a hydrogen atom, a sulfo group, an unsubstituted or substituted $C_1$ to $C_{20}$ alkylsulfonyl group, an unsubstituted or substituted $C_6$ to $C_{14}$ arylsulfonyl group and an unsubstituted or substituted $C_7$ to $C_{20}$ sulfamoyl group, and $R_{b1}$ to $R_{b8}$ each is independently a hydrogen atom. Additionally, for achieving better mutual solubility with solvents, either one of $R_{a1}$ and $R_{a2}$, either one of $R_{a3}$ and $R_{a4}$, either one of $R_{a5}$ and $R_{a6}$, and either one of $R_{a7}$ and $R_{a8}$, any four of them are preferably not all hydrogen atoms.

When $R_{a1}$ to $R_{a8}$ and $R_{b1}$ to $R_{b8}$ have the substituents respectively, specific examples of the substituents are: a $C_1$ to $C_{20}$, linear or cyclic, unsubstituted or substituted alkyl group (for example, methyl, ethyl, isopropyl, cyclohexyl, benzyl, phenylethyl), a $C_6$ to $C_{18}$ unsubstituted or substituted aryl group (for example, phenyl, chlorophenyl, 2,4-di-tert-butyl phenyl, 1-naphthyl group), a $C_2$ to $C_{20}$ unsubstituted or substituted alkenyl group (for example, vinyl, 2-methyl vinyl group), a $C_2$ to $C_{20}$ unsubstituted or substituted alkynyl group (for example, ethynyl, 2-methyl ethynyl, 2-phenyl ethynyl group), a halogen atom (for example, fluorine, chlorine, bromine, iodine), a cyano group, a hydroxyl group, a carboxyl, a $C_2$ to $C_{20}$ unsubstituted or substituted acyl group (for example, acetyl, benzoyl, salicyl anilide, trimethyl acetyl group), a $C_1$ to $C_{20}$ unsubstituted or substituted alkoxy group (for example, methoxyl, butoxyl, cyclohexyloxy group), a $C_6$ to $C_{20}$ unsubstituted or substituted aryloxy group (for example, phenoxyl, 1-naphthoxy, p-methoxy-phenoxyl group), a $C_1$ to $C_{20}$ unsubstituted or substituted alkylthio group (for example, methylthio, butylthio, benzylthio, 3-methoxyl propyl thio group), a $C_6$ to $C_{20}$ unsubstituted or substituted arylthio group (for example, thiophenyl, 4-chlorine thiophenyl group), a $C_1$ to $C_{20}$ unsubstituted or substituted alkylsulfonyl group (for example, methane sulfonyl, butane sulfonyl), a $C_6$ to $C_{20}$ unsubstituted or substituted arylsulfonyl (for example: benzenesulfonyl, p-toluenesulfonyl), a $C_1$ to $C_{17}$ unsubstituted or substituted carbamoyl (for example, carbamoyl without substitution, methyl carbamoyl, ethyl carbamoyl, n-butyl carbamoyl, dimethyl carbamoyl), a $C_1$ to $C_{16}$ unsubstituted or substituted amine (for example, acetamino, benzamido), a $C_2$ to $C_{20}$ unsubstituted or substituted acyloxy group (for example, acetoxy group, benzoyloxy), a $C_2$ to $C_{20}$ unsubstituted or substituted alkoxycarbonyl (for example, methoxycarbonyl, ethoxycarbonyl), five- or six-membered nitrogen-containing heterocyclic group (for example, aromatic heterocyclic groups such as pyridyl, thienyl, furyl, thiazolyl, imidazolyl, pyrazolyl groups and the like; non-aromatic heterocyclic groups such as pyrrolidine ring, piperidine ring, morpholine ring, pyranoid ring, sulphopyranoid ring, dioxane ring, dithiolane ring and the like).

Preferably, the substituents of $R_{a1}$ to $R_{a8}$ and $R_{b1}$ to $R_{b8}$ each is independently selected from the group consisting of a $C_1$ to $C_{16}$, linear or cyclic, unsubstituted or substituted alkyl group, a $C_6$ to $C_{14}$ aryl group, a $C_1$ to $C_{16}$ alkoxy group, a $C_6$ to $C_{14}$ aryloxy group, a halogen atom, a $C_2$ to $C_{17}$ alkoxycarbonyl group, a $C_1$ to $C_{10}$ carbamoyl group and a $C_1$ to $C_{10}$ amide group.

More preferably, the substituents of $R_{a1}$ to $R_{a8}$ and $R_{b1}$ to $R_{b8}$ each is independently selected from the group consisting of a $C_1$ to $C_{10}$, linear or cyclic, unsubstituted or substituted alkyl group, a $C_6$ to $C_{10}$ aryl group, a $C_1$ to $C_{10}$ alkoxy group, a $C_6$ to $C_{10}$ aryloxy group, chlorine atom, a $C_2$ to $C_{11}$ alkoxycarbonyl group, a $C_1$ to $C_7$ carbamoyl group and a $C_1$ to $C_8$ amide group.

Especially more preferably, the substituents of $R_{a1}$ to $R_{a8}$ and $R_{b1}$ to $R_{b8}$ each is independently selected from the group consisting of a $C_1$ to $C_8$, linear or cyclic, unsubstituted or substituted alkyl group, a $C_1$ to $C_8$ alkoxy group, a $C_3$ to $C_9$ alkoxycarbonyl group, phenyl group and chlorine atom. Even more preferably, the substituents of $R_{a1}$ to $R_{a8}$ and $R_{b1}$ to $R_{b8}$ each is independently a $C_1$ to $C_6$ unsubstituted alkoxy group.

The phthalocyanine dye (C-3) represented by the Formula (VI) or (VII) of the present invention can form a polymer from the linkage of repeating units at any sites thereof, and each unit may be same or different in such case. The phthalocyanine dye (C-3) also may be linked with a polymer chain such as polystyrene, polymethacrylate, polyvinyl alcohol, cellulose and the like.

The phthalocyanine dye (C-3) shown in Formula (VI) or (VII) of the present invention may be used alone with a particular compound or in combinations of a mixture of multiple compounds with different structures. Preferably, the phthalocyanine dye (C-3) uses the mixture of isomers having substituents at different substitution sites.

In preferred example of the present invention, the phthalocyanine dye (C-3) also may include the structure represented by the Formula (VIII), Formula (IX), Formula (X), Formula (XI) or Formula (XII):

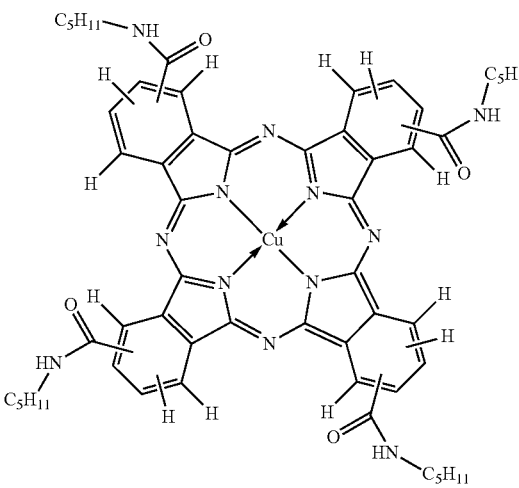

(VIII)

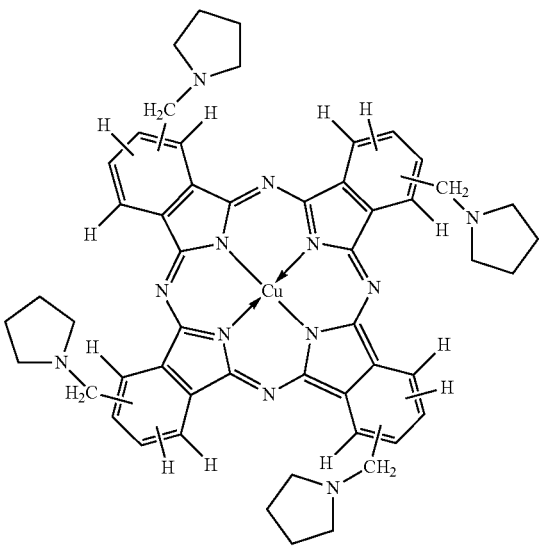

(IX)

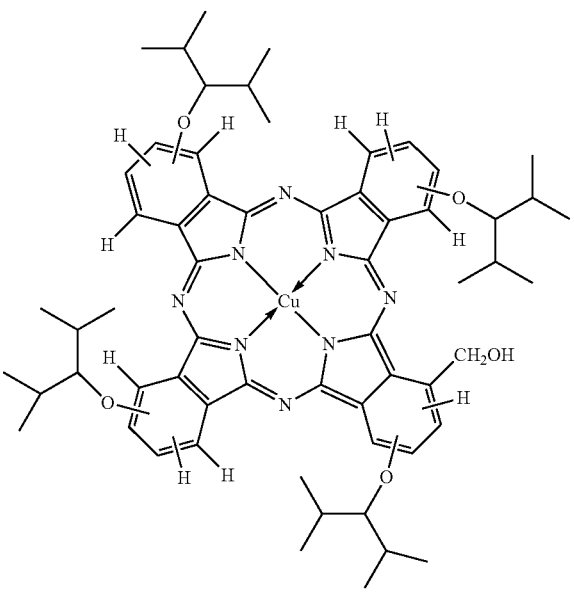

(X)

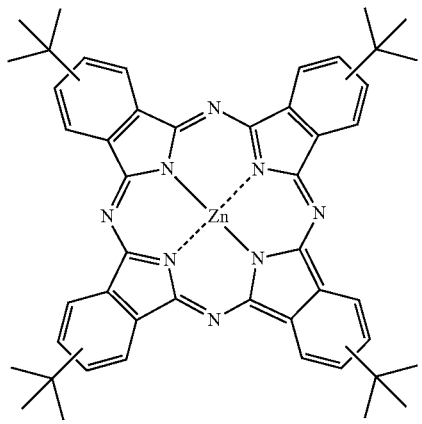

(XI)

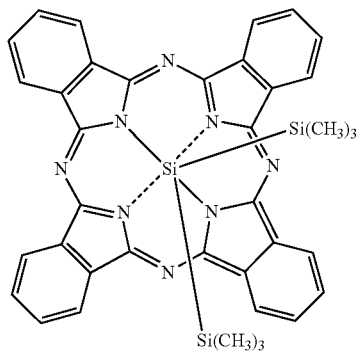

(XII)

The phthalocyanine dye (C-3) of the present invention may be many commercially available dyes, such as: C.I. Acid Blue 249, C.I. Solvent Blue 25, C.I. Solvent Blue 55, Solvent Blue 64 (trade name of Neptun Blue 698, made by BASF), Solvent Blue 67, C.I. Solvent Blue 70 (trade name of Neozapon Blue 807, made by BASF), C.I. Direct Blue 199, C.I. Direct Blue 86 (trade name of Turquoise Blue, made by Italia Incorporation) and the like.

When the positive photosensitive resin composition uses the phthalocyanine dye (C-3), the pattern formed subsequently may have better resolution.

Based on the novolac resin (A) as 100 parts by weight, the amount of the phthalocyanine dye (C-3) is 3 parts by weight to 60 parts by weight, however, 4 parts by weight to 55 parts by weight is preferred, and 5 parts by weight to 50 parts by weight is more preferred.

In other embodiments, the positive photosensitive resin composition of the present invention may optionally further include a perinone dye, a perylene dye, an azo dye, a methane dye, a quinoline dye, an azine dye, an anthraquinone dye, an indigo dye, an oxonol dye, a thiazine dye, an anthrapyridone dye, a xanthene dye or a benzopyran dye and the like.

Solvent (D)

The solvent (D) used for the positive photosensitive resin composition of the present invention refers to organic solvents that easily dissolve with but do not react with other organic components.

In a specific embodiment of the present invention, the solvent (D) is (poly)alkylene glycol monoalkyl ethers such as ethylene glycol monomethyl ether, ethylene glycol monoethyl ether, diethylene glycol monomethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether and the like; (poly)alkylene glycol monoalkyl ether acetates such as ethylene glycol monomethyl ether acetate, ethylene glycol monoethyl ether acetate, propylene glycol monomethyl ether acetate, propylene glycol ether acetate and the like; ethers such as diethylene glycol dimethyl ether, diethylene glycol methyl ether, diethylene glycol diethyl ether, tetrahydrofuran and the like; ketones such as methyl ethyl ketone, cyclohexanone, 2-heptanone, 3-heptanone and the like; lactic acid alkyl esters such as methyl 2-hydroxypropanoate methyl lactate, ethyl 2-hydroxypropanoate (also known as ethyl lactate) and the like; other esters such as methyl 2-hydroxy-2-methpropionate, ethyl 2-hydroxy-2-methpropionate, methyl 3-methoxypropionate, ethyl 3-methoxypropionate, methyl 3-ethoxypropionate, ethyl 3-ethoxypropionate, ethoxyethyl acetate, hydroxyethyl acetate, methyl 2-hydroxy-3-methylbutyrate, 3-methyl-3-methoxybutyl acetate, 3-methyl-3-methoxybutyl propionate, ethyl acetate, n-propyl acetate, isopropyl acetate, n-butyl acetate, isobutyl acetate, n-amyl acetate, isoamyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, ethyl 2-oxobutyrate and the like; aromatic hydrocarbons such as methylbenzene, dimethylbenzene and the like; carboxylic acid amides such as N-methylpyrrolidone, N,N-dimethylformamide, N,N-dimethylacetamide and the like. The aforementioned solvent (D) can be used alone or in combinations of two or more. Preferably, the solvent (D) is propylene glycol monoethyl ether, propylene glycol monomethyl ether acetate or ethyl lactate.

In a specific embodiment of the present invention, based on the amount of novolac resin (A) as 100 parts by weight, the amount of the aforementioned solvent (D) is generally from 500 to 2,000 parts by weight; preferably from 500 to 1,500 parts by weight; more preferably from 1,000 to 1,500 parts by weight.

Additive (E)

The positive photosensitive resin composition of the present invention may optionally include an additive (E), which may include but not limited to: an adhesiveness improver, a surface leveling agent, a dilutent, a sensitizer and the like.

The aforementioned adhesiveness improver may include but not limited to a melamine compound and a silane compound, so as to improve the adhesiveness of the positive photosensitive resin composition adhered to the substrate. Specific examples of the aforementioned melamine are, for example, commercially available products Cymel-300, Cymel-303 (manufactured by CYTEC); MW-30 MH, MW-30, MS-11, MS-001, MX-750 or MX-706 (manufactured by Sanwa Chemical). Specific examples of the aforementioned silane compound are, for example, vinyl trimethoxysilane, vinyl triethoxysilane, 3-methyl acryloxypropyl trimethoxysilane, 3-acryloxypropyl trimethoxysilane, vinyl tri(2-methoxyethoxy)silane, N-(2-aminoethyl)-3-aminopropyl methyl dimethoxy silane, N-(2-aminoethyl)-3-aminopropyl trimethoxysilane, 3-aminopropyl triethoxysilane, 3-glycidoxypropyl trimethoxysilane, 3-glycidoxypropyl dimethyl methoxysilane, 2-(3,4-epoxycyclohexyl)ethyl trimethoxysilane, 3-chloropropylmethyl dimethoxysilane, 3-chloropropyltrimethoxysilane, 3-mercapto propyl trimethoxy silane or bis-1,2-(trimethoxysilane) ethane.

In a specific embodiment of the present invention, based on the amount of novolac resin (A) as 100 parts by weight, the amount of the adherence additive in the aforementioned melamine compound is generally from 0 part by weight to 20 parts by weight, preferably from 0.5 parts by weight to 18 parts by weight, and more preferably from 1.0 parts by weight to 15 parts by weight; and the amount of the adherence additive in the aforementioned silane compound is generally from 0 parts by weight to 2 parts by weight, preferably from 0.001 parts by weight to 1 parts by weight, and more preferably from 0.005 parts by weight to 0.8 parts by weight.

The aforementioned surface leveling agent may include but not limited to a fluorine surfactant or a silane surfactant. Specific examples of the aforementioned fluorine surfactant are, for example, commercially available Flourate FC-430, FC-431 (manufactured by 3M) or F top EF122A, 122B, 122C, 126, BL20 (manufactured by Tochem product). Specific examples of the aforementioned silane surfactant are, for example, commercially available SF8427 or SH29PA (manufactured by Toray Dow Corning Silicone).

In a specific embodiment of the present invention, based on the amount of novolac resin (A) as 100 parts by weight, the amount of the aforementioned surfactant is generally from 0 parts by weight to 1.2 parts by weight, preferably from 0.025 parts by weight to 1.0 parts by weight, and more preferably from 0.050 parts by weight to 0.8 parts by weight.

Specific example of the aforementioned diluent is, for example, the commercially available products such as RE801 or RE802 (manufactured by Teikoku Printing Inks Mfg. Co., Ltd).

Specific examples of the aforementioned sensitizer are, for example, commercially available products such as TPPA-1000P, TPPA-100-2C, TPPA-1100-3C, TPPA-1100-4C, TPPA-1200-24X, TPPA-1200-26X, TPPA-1300-235T, TPPA-1600-3M6C or TPPA-MF (manufactured by Honshu Chemical Industry Co., Ltd.), and preferably TPPA-600-3M6C or TPPA-MF. The aforementioned sensitizer can be alone or in combinations of two or more.

In a specific embodiment of the present invention, based on the amount of novolac resin (A) as 100 parts by weight, the amount of the aforementioned sensitizing agent is generally from 0 parts by weight to 20 parts by weight, preferably from 0.5 parts by weight to 18 parts by weight, and more preferably from 1.0 parts by weight to 5 parts by weight.

Furthermore, the present invention can also use other additives if necessary, such as plasticizers and stabilizers.

The aforementioned additives (E) can be used alone or in combinations of two or more.

Preparation Method of Positive Photosensitive Resin Composition

In general, the positive photosensitive resin composition of the present invention is prepared by mixing the aforementioned novolac resin (A), ortho-naphthoquinone diazide sulfonic acid ester (B), dye (C) and solvent (D) in a conventional mixer uniformly until all components are formed into form a solution state, optionally adding various additives (E) thereto if necessary, so as to obtain the positive photosensitive resin composition.

Method for Forming Patterns

The aforementioned resulted positive photosensitive composition is sequentially subjected to a prebake step, an exposure step, a development step and a postbake step to form a pattern on a substrate.

Particularly, the method for forming a pattern using the aforementioned positive photosensitive resin composition of the present invention is that by methods of spin coating, curtain coating or roll coating and the like, the aforementioned positive photosensitive resin composition is coated on the substrate, and the solvent is prebaked and removed after coating, so as to form a prebaked coating film. The conditions of prebake can be varied according to kings and mixture ratios of various components, and the prebaking is typically performed at a temperature of 70 to 110° C. for 1 to 15 minutes.

After being prebaking, the coated film is exposed under a desired light mask, and then the film is immersed in a developing solution at a temperature of 23±2° C. for 15 seconds to 5 minutes, so as to remove the undesired areas and form a given pattern. The exposure light is preferably UV light such as g-line, h-line, i-line and so on, which may be generated by a UV illumination device such as (super) high-pressure mercury lamp and metal halide lamp.

Specific examples of the developing solution used in the present invention are alkaline compounds such as sodium hydroxide, potassium hydroxide, sodium carbonate, sodium bicarbonate, potassium carbonate, potassium bicarbonate, sodium silicate, sodium methyl silicate, ammonia solution, ethylamine, diethylamine, dimethylethylanolamine, tetramethylammonium hydroxide, tetraethylammonium hydroxide, choline, pyrrole, piperidine or 1,8-diazabicylo-[5,4,0]-7-undecene and the like.

Preferably, the concentration of the developing solution is preferably 0.001 wt % to 10 wt %, more preferably 0.005 wt % to 5 wt %, and much more preferably 0.01 wt % to 1 wt %.

When the developing solution including the aforementioned alkaline compounds is used, the coated film can be washed by water after being developed, and then the coated film is dried through compressed air or compressed nitrogen gas. Subsequently, the film is postbaked through a heating apparatus such as a hot plate or an oven. The postbake step can be carried out at 100° C. to 250° C. for 1 to 60 minutes on the hot plate or for 5 to 90 minutes in the oven. After the aforementioned steps, a pattern is formed on the substrate.

TFT Array Substrate

The TFT array substrate of the present invention is manufactured through the aforementioned method. In brief, the positive photosensitive resin composition of the present invention is coated on a glass substrate or plastic substrate by using coating methods such as spin coating, curtain coating or roll coating, to form a positive photoresist layer. Subsequently, after the positive photoresist layer is treated through the steps of prebake, exposure development and postbake, the resulted photosensitive resin pattern is etched and stripped. After the aforementioned steps are repeated, a TFT array substrate including multiple TFTs or electrodes is obtained.

Reference is made to FIG. 1, which illustrates a partially cross-sectional view of a TFT array substrate used for a LCD device according to an embodiment of the present invention. Firstly, a gate electrode 102a and a storage capacitor Cs electrode 102b are configured on an aluminium thin film of a glass substrate 101. Moreover, a silicon oxide ($SiO_x$) film 103 or silicon nitride ($SiN_x$) film 104 is covered with the gate electrode 102a to form a dielectric film, and then an amorphous silicon (a-Si) layer 105 is formed on the dielectric film as a semiconductor active layer. Afterwards, in order to reduce the interface impedance, an amorphous silicon layer 106 doped with nitrogen impurities may be disposed on the amorphous silicon layer 105. Then, a metal such as aluminium is formed to a drain electrode 107a and a source electrode 107b, in which the drain electrode 107a is connected to a data signal line (unshown), and the source electrode 107b is connected to a pixel electrode (or called as a subpixel electrode) 109. Thereafter, a silicon nitride film is disposed as a protective film 108 for protecting the underlying semiconductor active layer such as the amorphous silicon layer 105, the drain electrode 107a, the source electrode 107b and the like.

LCD Device

The LCD device of the present invention at least includes the aforementioned TFT array substrate, as well as other components if necessary.

The specific examples of the basic structure of the aforementioned LCD unit are as follows. (1) The TFT array substrate (driving substrate) is arranged by driving devices such as TFT and the pixel electrode. A color filter substrate includes a color filter and a counter electrode (or called as a conductive layer). The TFT array substrate (driving substrate) and the color filter substrate are opposed to each other where spacers are interposed therebetween. The space between the two substrates is filled with liquid crystal material and then sealed to form the LCD device. Alternatively, (2) an integrated TFT array substrate is provided which includes a color filter directly formed on the aforementioned TFT array substrate of the present invention. The integrated TFT array substrate and a counter substrate with a counter electrode (conductive layer) are opposed to each other where spacers are interposed therebetween. The space between the two substrates is filled with liquid crystal material and then sealed to form the LCD device. The aforementioned liquid crystal material can be any prior LC compound or composition without any limitation.

The specific example of the aforementioned conductive layer is an indium-tin oxide (ITO) film; metal films such as aluminum, zinc, copper, iron, nickel, chromium and molybdenum and the like; or metal oxide films such as silicon dioxide and the like. Preferably, the conductive layer is a transparent film layer, and more an ITO film.

Specific examples of the substrates used for the TFT array substrate, the color filter substrate and the counter substrate of the present invention are conventional glasses such as Na—Ca glass, low-expansion glass, alkali-free glass or quartz glass. In addition, a substrate constituted by plastic films also can be used.

Thereinafter, various applications of the present invention will be described in more details referring to several exemplary embodiments below, while not intended to be limiting. Thus, one skilled in the art can easily ascertain the essential characteristics of the present invention and, without departing from the spirit and scope thereof, can make various changes and modifications of the invention to adapt it to various usages and conditions.

BRIEF DESCRIPTION OF THE DRAWINGS

In order to make the above aspects, features, advantages and embodiments of the present invention more apparent, the accompanying drawings are illustrated as follows:

FIG. 1 illustrates a partially cross-sectional view of a TFT array substrate used for a LCD device according to an embodiment of the present invention.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Preparation of Novolac Resin (A)

The hydroxy-type novolac resin (A-1) was prepared by Synthesis Examples A-1-1 to A-1-5 according to Table 1.

Synthesis Example A-1-1

A 1000 mL four-necked conical flask equipped with a nitrogen inlet, a stirrer, a heater, a condenser and a thermometer was purged with nitrogen, and the following components were charged to the flask. The aforementioned components comprising 0.70 moles of m-cresol, 0.30 moles of p-cresol, 0.5 moles of 3,4-dihydroxybenzaldehyde and 0.020 moles of oxalic acid were stirred slowly and heated to 100° C., so as to carry out polycondensation for 6 hours. Next, the reaction was heated again to 180° C. and then dried under a decreased pressure at 10 mmHg for evaporating the solvent, thereby obtaining a hydroxy-type novolac resin (A-1-1).

Synthesis Examples A-1-2 to A-1-5

Synthesis Examples A-1-2 to A-1-5 were practiced with the same method as in Synthesis Example A-1-1 by using different kinds and different amounts of the components of the hydroxy-type novolac resin (A-1). The formulations of Synthesis Examples A-1-2 to A-1-5 were also listed in TABLE 1 rather than focusing or mentioning them in details.

Synthesis Examples A-2-1 to A-2-3

Synthesis Examples A-2-1 to A-2-3 were practiced with the same method as in Synthesis Example A-1 by using different kinds and different amounts of the components of the other hydroxy-type novolac resin (A-2). The formulations of Synthesis Examples A-2-1 to A-2-3 were also listed in TABLE 1 rather than focusing or mentioning them in details.

Preparation of Positive Photosensitive Resin Composition

The following examples are directed to the preparation of the positive photosensitive resin composition of Examples 1 to 13 and Comparative Examples 1 to 6 according to TABLES 2 and 3.

Example 1

100 parts by weight of the hydroxy-type novolac resin (A-1-1) of the Synthesis Example A-1-1, 25 parts by weight of 2,3,4-trihydroxybenzophenone and 1,2-naphthoquinone diazide-5-sulfonic acid ester (B-1) (85% of average esterification degree), 5 parts by weight of 2,3,4,4'-tetrahydroxy benzophenone and 1,2-naphthoquinone diazide-5-sulfonic acid ester (B-2), 2 parts by weight of C.I. Solvent Black 3 (trade name of Sudan Black 141; manufactured by Chuo synthetic Chemical Co., Ltd.; C-1-1) and 1 parts by weight of C.I. Acid Violet 17 (trade name of Coomassie Violet R200, manufactured by Sigma; C-2-1) were added into 1000 parts by weight of propylene glycol monomethyl ether acetate (PGMEA) of the solvent (D-1), and the aforementioned mixture was stirred and dissolved in the solvent by a shaking mixer, so as to form a positive photosensitive resin composition of Example 1 of the present invention. And then, the properties of the positive photosensitive resin composition were determined by using the following evaluation methods and resulted in TABLE 2. The detection methods of the post-etch decolorization ratio, the resolution and the film-remaining ratio were described as follows.

Examples 2 to 13

Examples 2 to 13 were practiced with the same method as in Example 1 by using different kinds and different amounts of the components of the positive photosensitive resin composition. The formulations of Examples 2 to 13 were also listed in TABLE 2 rather than focusing or mentioning them in details.

Comparative Examples 1 to 6

Comparative Examples 1 to 6 were practiced with the same method as in Example 1 by various kinds or usage of the components. The formulation and the evaluation results were also listed in TABLE 3.

TABLE 1

| | Composition (Moles) | | | | | | | | | | | |
|---|---|---|---|---|---|---|---|---|---|---|---|---|
| | Aromatic Hydroxyl Compound | | | | Hydroxyphenyl Cockroach Aldehydes | | | | Aldehydes Except Hydroxybenzaldehyde | | | Reaction | |
| | | | | | 3,4-dihydroxy | o-hydroxy | 2,3,4-trihydroxy | o-hydroxymethyl | | | Catalyst | Temper- | Condensation |
| Synthesis Examples | o-cresol | m-cresol | p-cresol | 2,5-xylenol | benzaldehyde | benzaldehyde | benzaldehyde | benzaldehyde | formaldehyde | benzaldehyde | oxalic acid | ature (°C.) | Time (Hour) |
| A-1-1 | | 0.70 | 0.30 | | 0.50 | | | | | | 0.020 | 100 | 6 |
| A-1-2 | 0.05 | 0.30 | 0.65 | | | 0.60 | | | | | 0.015 | 95 | 6 |
| A-1-3 | | 0.35 | 0.60 | 0.05 | 0.20 | 0.20 | | | | | 0.020 | 100 | 6 |
| A-1-4 | | 0.60 | 0.40 | | | | 0.50 | | | | 0.020 | 100 | 6 |
| A-1-5 | | 0.50 | 0.50 | | | | | 0.60 | | | 0.020 | 100 | 6 |
| A-2-1 | | 0.50 | 0.50 | 0.05 | | | | | | 0.45 | 0.015 | 100 | 6 |
| A-2-2 | | 0.30 | 0.70 | | | | | | 0.40 | | 0.020 | 100 | 6 |
| A-2-3 | | 0.45 | 0.50 | 0.05 | | | | | | 0.50 | 0.020 | 100 | 6 |

TABLE 2

| | | Examples | | | | | | | | | | | | |
|---|---|---|---|---|---|---|---|---|---|---|---|---|---|---|
| Composition | | 1 | 2 | 3 | 4 | 5 | 6 | 7 | 8 | 9 | 10 | 11 | 12 | 13 |
| Novolac Resin (A) (parts by weight) | A-1-1 | 100 | | | | | 30 | | | | 100 | | | |
| | A-1-2 | | 100 | | | | | 20 | | | | | | |
| | A-1-3 | | | 100 | | | | | 10 | 50 | | 100 | | |
| | A-1-4 | | | | 50 | | | | | | | | 100 | |
| | A-1-5 | | | | | 70 | | | | | | | | 100 |
| | A-2-1 | | | | | | 30 | | 90 | 50 | | | | |
| | A-2-2 | | | | 50 | | | 80 | | | | | | |
| | A-2-3 | | | | | | 70 | | | | | | | |
| o-Naphthoquinone Diazide Sulfonic Acid Ester (B) (parts by weight) | B-1 | 25 | 20 | 15 | 25 | 15 | 15 | 20 | 25 | 20 | 15 | 20 | 30 | 35 |
| | B-2 | 5 | | 5 | | | 5 | | | 5 | | | | |
| Dye (C) (parts by weight) | Diazo Dye, Anthraquinone Dye And Chromium (III, $Cr^{3+}$) Azo Dye (C-1) | C-1-1 | 2 | | | 10 | | | | 12 | 5 | | | 7 | |
| | | C-1-2 | | 5 | | 5 | 25 | | 7 | | | 10 | | 8 | 2 |
| | | C-1-3 | | | 10 | | | 2 | | | | 30 | | | |
| | Triarylmethane Dye (C-2) | C-2-1 | 1 | | | 10 | | | 3 | 3 | | | | 10 | |
| | | C-2-2 | | 3 | | | 1 | 5 | 3 | | 2 | | 5 | | 1 |
| | | C-2-3 | | | 6 | | | 5 | | | | 7 | | | |
| | Phthalocyanine Dye (C-3) | C-3-1 | | | | | | | | | 3 | | 20 | | 10 |
| | | C-3-2 | | | | | | | | | | 20 | | 60 | |
| | | C-3-3 | | | | | | | | | | 20 | | | |
| Solvent (D) (parts by weight) | D-1 | 1000 | 500 | 500 | 1000 | 800 | 1000 | 500 | 500 | 800 | 600 | 1000 | 700 | 1500 |
| | D-2 | | | 500 | | 200 | | | 500 | | 400 | 1000 | 300 | |
| | D-3 | | | | 500 | | | | | 200 | | | | |
| Additives (E) (parts by weight) | E-1 | | | | 0.3 | | | | 1 | | | | 1 | |
| | E-2 | | | | | | 2 | | | | | | | |
| Evaluation Methods | C-1/C-2 | 2.0 | 1.7 | 1.7 | 1.5 | 25.0 | 0.2 | 1.2 | 4.0 | 2.5 | 1.4 | 6.0 | 1.5 | 2.0 |
| | Post-Etch Decolorization Ratio | ◉ | ◉ | ◉ | ◉ | ○ | ○ | ◉ | ◉ | ◉ | ◉ | ◉ | ◉ | ◉ |
| | Resolution | ○ | ○ | ○ | ○ | ○ | ○ | ○ | ○ | ◉ | ◉ | ◉ | ◉ | ◉ |
| | Film-Remaining Ratio | ◉ | ◉ | ◉ | ◉ | ◉ | ◉ | ○ | ○ | ◉ | ◉ | ◉ | ◉ | ◉ |

TABLE 3

| Composition | | Comparative Examples | | | | | |
|---|---|---|---|---|---|---|---|
| | | 1 | 2 | 3 | 4 | 5 | 6 |
| Novolac Resin (A) (parts by weight) | A-1-1 | | | 100 | | | |
| | A-1-2 | | | | | | |
| | A-1-3 | | | | 100 | | |
| | A-1-4 | | | | | | |
| | A-1-5 | | | | | | |
| | A-2-1 | | | | | 100 | |
| | A-2-2 | 100 | | | | | |
| | A-2-3 | | 100 | | | | 100 |
| O-Naphthoquinone Diazide Sulfonic Acid Ester (B) (parts by weight) | B-1 | 25 | 20 | 15 | 20 | 25 | 20 |
| | B-2 | | 5 | 10 | | | |
| Dye (C) (parts by weight) — Diazo Dye, Anthraquinone Dye And Chromium (III, $Cr^{3+}$) Azo Dye (C-1) | C-1-1 | 10 | | | 10 | | |
| | C-1-2 | | 5 | | | 10 | |
| | C-1-3 | | | | | | |
| Triarylmethane Dye (C-2) | C-2-1 | 5 | | | | | 5 |
| | C-2-2 | | 10 | | | | |
| | C-2-3 | | | 5 | | | |
| Phthalocyanine Dye (C-3) | C-3-1 | | | | | | |
| | C-3-2 | | | | | | |
| | C-3-3 | | | | | | |
| Solvent (D) (parts by weight) | D-1 | 1000 | | | 1000 | | |
| | D-2 | | 1000 | | | 1000 | |
| | D-3 | | | 1000 | | | 1000 |
| Additives (E) (parts by weight) | E-1 | | | | | | |
| | E-2 | | | | | | |
| Evaluation Methods | C-1/C-2 | 2.0 | 0.5 | 0.0 | — | — | 0.0 |
| | Decoloring Ratio After Being Etched | X | X | ○ | ○ | X | X |
| | Resolution | X | X | X | X | X | X |
| | Film Damage Ratio | ○ | ○ | X | X | X | X |

B-1 2,3,4-trihydroxybenzophenone and 1,2-naphthoquinone diazide-5-sulfonic acid ester
B-2 2,3,4,4'-tetrahydroxybenzophenone and 1,2-naphthoquinone diazide-5-sulfonic acid ester
C-1-1 C.I. Solvent Black 3 (trade name of Sudan Black 141; manufactured by Chuo synthetic Chemical Co., Ltd)
C-1-2 C.I. Solvent Black 34 (trade name of VALIFAST Black 3804; MANUFACTURED BY ORIENT CHEMICAL)
C-1-3 C.I. Solvent Black 27 (trade name of Neozapon Black X51; manufactured by BASF)
C-2-1 C.I. Acid Violet 17 (trade name of Coomassie Violet R200; manufactured by Sigma)
C-2-2 C.I. Basic Blue 7 (trade name of Basonyl Blau 636; manufactured by BASF)
C-2-3 C.I. Acid Blue 83 (trade name of Brilliant Blue R: manufactured by Trust Chem)
C-3-1 C.I. Direct Blue 86 (trade name of Turquoise Blue; manufactured by Italia Incorporation)
C-3-2 C.I. Solvent Blue 70 (trade name of Neozapon Blue 807; manufactured by BASF)
C-3-3 C.I. Solvent Blue 64 (trade name of Neptun Blue 698; manufactured by BASF)
D-1 Propylene glycol monomethyl ether acetate (PGMEA)
D-2 Ethyl lactate (EL)
D-3 Propylene glycol monoethyl ether (PGEE)
E-1 Surfactant: trade name of SF8427 (manufactured by Toray Dow Corning Silicone)
E-2 Adherence additive: trade name of Cymel-303 (manufactured by CYTEC)

Evaluation Methods

1. Post-Etch Decolorization Ratio

The positive photosensitive resin compositions Examples 1 to 13 and Comparative Examples 1 to 6 were spin-coated on a glass substrate, and then prebaked at 110° C. for 160 seconds, thereby obtaining a prebaked and coated film with a thickness of about 1.5 μm. And then, the prebaked and coated film was placed under a given mask, and irradiated by ultraviolet light of 300 mJ/cm$^2$ (exposure machine Model No. AG500-4N; manufactured by M&R Nano Technology). Next, the film was developed in 2.38% of TMAH solution at 23° C. for 1 minute, and then the exposed portion of the film on the substrate was removed. Subsequently, the remained pattern of the films was washed by pure water and obtained. The film was postbaked at 220° C. for 40 minutes, and then etched by aluminic acid at 30° C., to obtain a glass substrate containing a pattern. The transmittance spectrum of the glass substrate containing the pattern (400 nm to 780 nm of detected spectrum wavelength) was measured by a luminousness detector (Model No. NCPD-300; manufactured by Otsuka Tech Electronics Co., Ltd.). Based on the luminousness of the glass substrate without pattern as the reference value, the luminousness of the glass substrate with the pattern was measured by the luminousness detector, and the value of the luminousness was 0% to 100%, and an evaluation was made according to the following criterion.

◉: Luminousness≤15%
○: 15%<Luminousness≤40%
x: 40%<Luminousness

2. Resolution

The positive photosensitive resin compositions of Examples 1 to 13 and Comparative Examples 1 to 6 were spin-coated on a glass substrate, and then prebaked at 110° C. for 160 seconds, thereby obtaining a prebaked and coated film with a thickness of about 1.5 μm. Subsequently, the prebaked and coated film was placed under a light mask of line and space (manufactured by Nippon Filcon Co., Ltd), and irradiated with ultraviolet light of 300 mJ/cm$^2$ (exposure machine Model No. AG500-4N; manufactured by M&R Nano Technology). Next, then the film was developed in 2.38% of TMAH solution at 23° C. for 1 minute. Afterwards, the exposed portion of the film on the substrate was removed. Subsequently, the film was washed by pure water and obtained, in which the minimum value of the linewidth of the pattern was defined as the resolution, and an evaluation was made according to the following criterion.

◉: Linewidth<2 μm
○: 2 μm≤Linewidth<3 μm
Δ: 3 μm≤Linewidth<5 μm
x: Linewidth≥5 μm 3. Film-Remaining Ratio The thickness ($\delta_{d1}$) of the prebaked and coated film resulted from the aforementioned "Evaluation Method 2. Resolution" was measured at any given location then the film was immersed and developed in a developing solution (2.38% of TMAH solution) at 23° C. for 1 minutes, followed by measuring another thickness ($\delta_{d2}$) of the prebaked and coated film at the same location. Later, the film-remaining ratio was calculated according to Formula (XIII) as below.

$$\text{Film-Remaining Ratio}(\%) = [(\delta_{d2})/(\delta_{d1})] \times 100 \quad \text{(XIII)}$$

◉: Film-Remaining Ratio>95%
○: 95%>Film-Remaining Ratio>90%
Δ: 90%>Film-Remaining Ratio>85%
x: Film-Remaining Ratio≤85%

The evaluation results of the post-etch decolorization ratio, the resolution and the film-remaining ratio of the positive photosensitive resin composition resulted from the aforementioned Examples and Comparative Examples were shown in Tables 2 and 3.

As shown in the results in Tables 2 and 3, when the positive photosensitive resin composition included the hydroxy-type novolac resin (A-1), the resulted pattern had less post-etch decolorization and better resolution. Moreover, the positive photosensitive resin composition further simultaneously included the at least one (C-1) selected from the group consisting of diazo dye, anthraquinone dye and chromium (III, $Cr^{3+}$) azo dye and the triarylmethane dye (C-2), the resulted pattern had better resolution and higher film-remaining ratio, and much better resolution could advantageously be achieved when such positive photosensitive resin composition further included the phthalocyanine dye (C-3), thereby achieving the purpose of the present invention actually.

It should be supplemented that, although specific compounds, components, reaction conditions, processes, evaluation methods or specific equipments are described as examples of the present invention, for illustrating the positive photosensitive resin composition of the present invention and the method for forming patterns by using the same. However, as is understood by a person skilled in the art instead of limiting to the aforementioned examples, the positive photosensitive resin composition of the present invention and the method for forming patterns by using the same also can be manufactured by using other compounds, components, reaction conditions, processes, evaluation methods and equipments without departing from the spirit and scope of the present invention.

Although the present invention has been disclosed with reference to the embodiments above, these embodiments are not intended to limit the present invention. In view of the foregoing, it is intended to cover various modifications and similar arrangements included within the spirit and scope of the appended claims. Therefore, the scope of the present invention should be accorded the broadest interpretation so as to encompass all such modifications and similar structure.

What is claimed is:

1. A positive photosensitive resin composition, comprising:
novolac resin (A), wherein the novolac resin (A) comprises a hydroxy-type novolac resin (A-1), and the hydroxy-type novolac resin (A-1) is formed by condensing a hydroxylbenzaldehyde compound and an aromatic hydroxyl compound;
ortho-naphthoquinone diazide sulfonic acid ester (B);
a dye (C), wherein the dye (C) comprises at least one (C-1) selected from the group consisting of diazo dye and chromium (III, $Cr^{3+}$) azo dye, as well as triarylmethane dye (C-2); and
a solvent (D), and
wherein based on an amount of the novolac resin (A) as 100 parts by weight, an amount of the ortho-naphthoquinone diazide sulfonic acid ester (B) is 5 parts by weight to 50 parts by weight, an amount of the dye (C) is 10 parts by weight to 50 parts by weight, an amount of the at least one (C-1) selected from the group consisting of diazo dye and chromium (III, $Cr^{3+}$) azo dye is 2 parts by weight to 30 parts by weight, an amount of the triarylmethane dye (C-2) is 1 part by weight to 10 parts by weight, and an amount of the solvent (D) is 500 parts by weight to 2000 parts by weight, and a weight ratio of the amount of the at least one (C-1) selected from the group consisting of diazo dye and chromium (III, $Cr^{3+}$) azo dye to the amount of the triarylmethane dye (C-2) is 2 to 9.

2. The positive photosensitive resin composition of claim 1, wherein based on an amount of the novolac resin (A) as 100 parts by weight, an amount of the hydroxy-type novolac resin (A-1) is 30 parts by weight to 100 parts by weight.

3. The positive photosensitive resin composition of claim 1, wherein a weight ratio of the amount of the at least one (C-1) selected from the group consisting of diazo dye and chromium (III, $Cr^{3+}$) azo dye to the amount of the triarylmethane dye (C-2) is 3 to 7.

4. The positive photosensitive resin composition of claim 1, wherein the triarylmethane dye (C-2) comprises a structure of Formula (I) or Formula (II) or salts thereof:

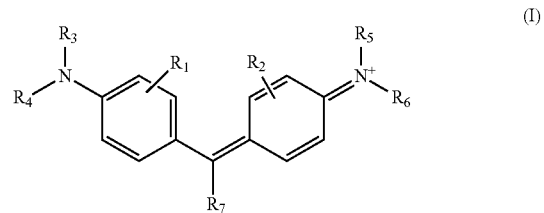

(I)

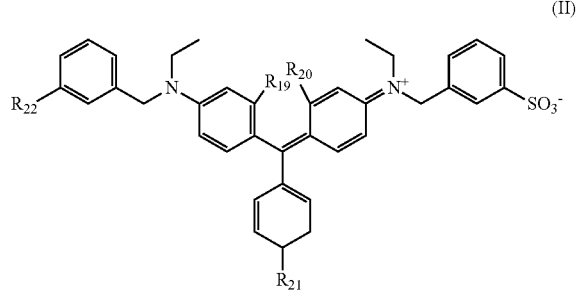

(II)

wherein, in Formula (I), $R_1$ and $R_2$ each is independently selected from the group consisting of a hydrogen atom, a halogen atom and an alkyl group with one to five carbon atoms; $R_3$, $R_4$, $R_5$ and $R_6$ each is independently selected from the group consisting of a hydrogen atom, a $C_1$ to $C_5$ alkyl group, phenyl and benzyl group; and $R_7$ is a structure selected from the group consisting of Formula (III), Formula (IV) and Formula (V):

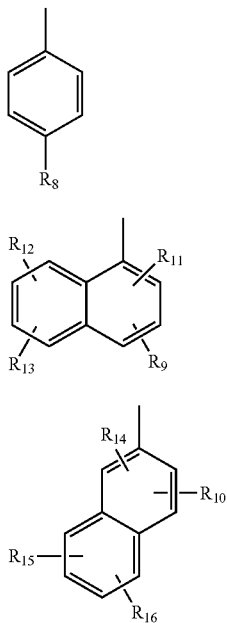

In the Formula (III), the Formula (IV) and the Formula (V), $R_8$ to $R_{10}$ each is selected from the group consisting of a hydrogen atom and $-NR_{17}R_{18}$; $R_{17}$ and $R_{18}$ each is independently selected from the group consisting of a hydrogen atom, a $C_1$ to $C_5$ alkyl group, benzyl, phenyl group and a phenyl group that comprises a $C_1$ to $C_3$ alkyl group or a $C_1$ to $C_3$ alkoxyl group substituted at a p position thereof; and $R_{11}$ to $R_{16}$ each is independently selected from the group consisting of a hydrogen atom, a hydroxyl group and $-SO^{3-}$; and In Formula (II), $R_{19}$ and $R_{20}$ each is independently selected from the group consisting of a hydrogen atom, a halogen atom and a $C_1$ to $C_5$ alkyl group; $R_{21}$ is selected from the group consisting of a hydrogen atom, $-SO^{3-}$, a carboxyl group, a $C_1$ to $C_3$ alkyl group, a $C_1$ to $C_3$ alkoxyl group and $-NR_{17}R_{18}$; and $R_{22}$ is selected from the group consisting of a hydrogen atom and $-SO^{3-}$.

5. The positive photosensitive resin composition of claim 1, wherein the dye (C) further comprises a phthalocyanine dye (C-3).

6. The positive photosensitive resin composition of claim 5, wherein based on an amount of the novolac resin (A) as 100 parts by weight, an amount of the phthalocyanine dye (C-3) is 3 parts by weight to 60 parts by weight.

7. The positive photosensitive resin composition of claim 5, wherein the phthalocyanine dye (C-3) comprises a structure of the Formula (VI):

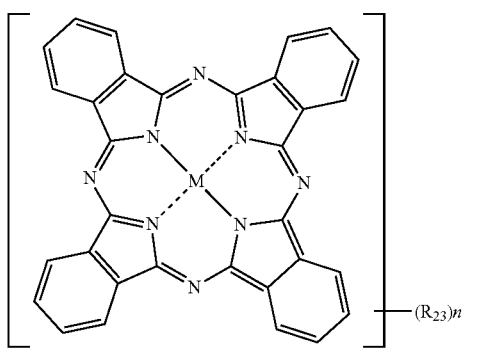

wherein $R_{23}$ is a substituted group independently selected from the group consisting of a hydrogen atom, a halogen atom, a cyano group, a nitro group, a formyl group, a carboxyl group, a sulfo group, an unsubstituted or substituted $C_1$ to $C_{20}$ alkyl group, an unsubstituted or substituted $C_6$ to $C_{24}$ aryl group, an unsubstituted or substituted $C_1$ to $C_{10}$ heterocyclic radical group, an unsubstituted or substituted $C_1$ to $C_{20}$ alkoxyl group, an unsubstituted or substituted $C_6$ to $C_{14}$ aryloxy group, an unsubstituted or substituted $C_2$ to $C_{21}$ acyl group, an unsubstituted or substituted $C_1$ to $C_{20}$ alkylsulfonyl group, an unsubstituted or substituted $C_6$ to $C_{14}$ arylsulfonyl group, an unsubstituted or substituted $C_1$ to $C_{10}$ heterocyclic sulfonyl group, an unsubstituted or substituted $C_1$ to $C_{25}$ carbamoyl group, an unsubstituted or substituted $C_0$ to $C_{32}$ sulfamoyl group, an unsubstituted or substituted $C_2$ to $C_{20}$ alkoxycarbonyl group, an unsubstituted or substituted $C_7$ to $C_{15}$ aryloxycarbonyl group, an unsubstituted or substituted $C_2$ to $C_{21}$ amide group, an unsubstituted or substituted $C_1$ to $C_{20}$ sulfonylamino group and an unsubstituted or substituted $C_0$ to $C_{36}$ amine group; n is a integer of 1 to 8; and M is selected from the group consisting of metals, metal chlorides, metal oxides and metal hydroxides.

8. A method for forming patterns, wherein the positive photosensitive resin composition of claim 1 is sequentially subjected to a prebake step, an exposure step, a development step and a postbake step, so as to form a pattern on a substrate, wherein the positive photosensitive resin composition comprising a novolac resin (A), an ortho-naphthoquinone diazide sulfonic acid ester (B), a dye (C), and a solvent (D), wherein the novolac resin (A) comprises a hydroxy-type novolac resin (A-1), the hydroxy-type novolac resin (A-1) is formed by condensing a hydroxylbenzaldehyde compound and an aromatic hydroxyl compound, and the dye (C) comprises at least one (C-1) selected from the group consisting of diazo dye, and chromium (III, $Cr^{3+}$) azo dye, as well as triarylmethane dye (C-2), and wherein based on an amount of the novolac resin (A) as 100 parts by weight, an amount of the ortho-naphthoquinone diazide sulfonic acid ester (B) is 5 parts by weight to 50 parts by weight, and amount of the dye (C) is 10 parts by weight to 50 parts by weight, an amount of the at least one (C-1) selected from the group consisting of diazo dye and chromium (III, $Cr^{3+}$) azo dye is 2 parts by weight to 30 parts by weight, an amount of the triarylmethane dye (C-2) is 1 part by weight to 10 parts by weight, an amount of the solvent (D) is 500 parts by weight to 2000 parts by weight, and a weight ratio of the amount of the at least one (C-1) selected from the group consisting of diazo dye and chromium (III, $Cr^{3+}$) azo dye to the amount of the triarylmethane dye (C-2) is 2 to 9.

9. The method for forming patterns of claim 8, wherein based on an amount of the novolac resin (A) as 100 parts by weight, an amount of the hydroxy-type novolac resin (A-1) is 30 parts by weight to 100 parts by weight.

10. The method for forming patterns of claim 8, wherein a weight ratio of the amount of the at least one (C-1) selected from the group consisting of diazo dye and chromium (III, $Cr^3\pm$) azo dye to the amount of the triarylmethane dye (C-2) is 3 to 7.

11. The method for forming patterns of claim 8, wherein the triarylmethane dye (C-2) comprises a structure of Formula (I) or Formula (II) or salts thereof:

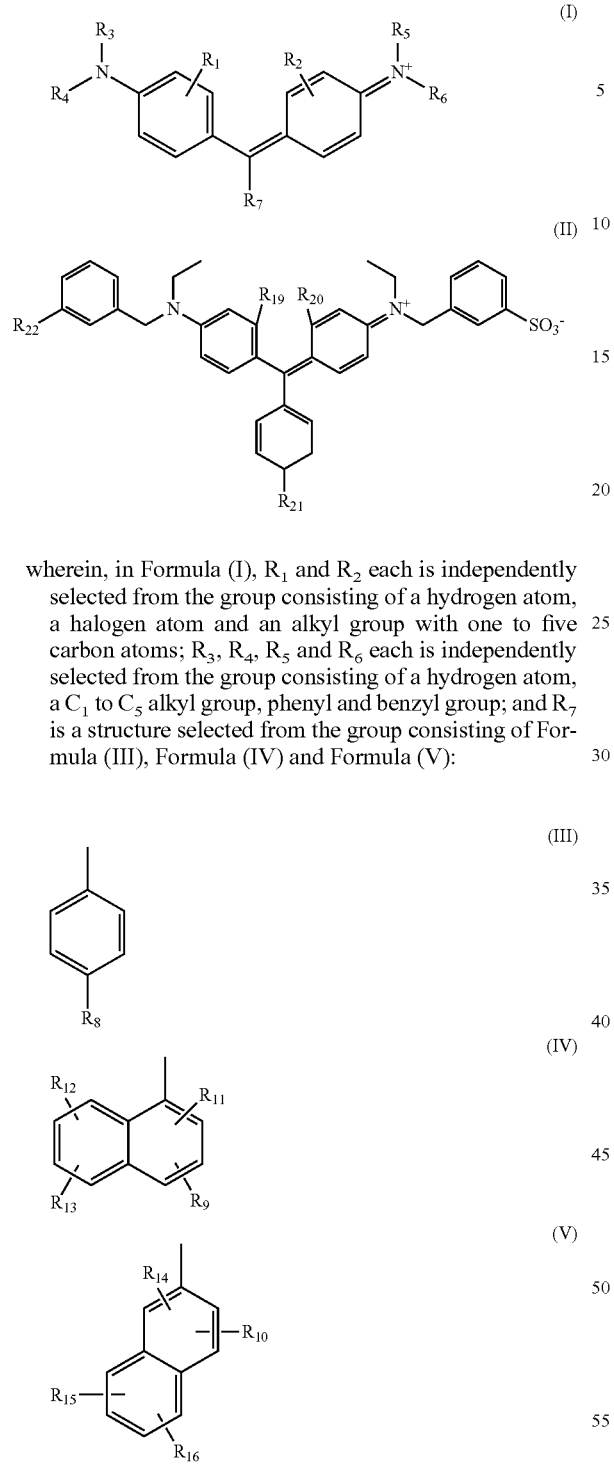

wherein, in Formula (I), $R_1$ and $R_2$ each is independently selected from the group consisting of a hydrogen atom, a halogen atom and an alkyl group with one to five carbon atoms; $R_3$, $R_4$, $R_5$ and $R_6$ each is independently selected from the group consisting of a hydrogen atom, a $C_1$ to $C_5$ alkyl group, phenyl and benzyl group; and $R_7$ is a structure selected from the group consisting of Formula (III), Formula (IV) and Formula (V):

In the Formula (III), the Formula (IV) and the Formula (V), $R_8$ to $R_{10}$ each is selected from the group consisting of a hydrogen atom and —$NR_{17}R_{18}$; $R_{17}$ and $R_{18}$ each is independently selected from the group consisting of a hydrogen atom, a $C_1$ to $C_5$ alkyl group, benzyl, phenyl group and a phenyl group that comprises a $C_1$ to $C_3$ alkyl group or a $C_1$ to $C_3$ alkoxyl group substituted at a p position thereof; and $R_{11}$ to $R_{16}$ each is independently selected from the group consisting of a hydrogen atom, a hydroxyl group and —$SO^{3-}$; and In Formula (II), $R_{19}$ and $R_{20}$ each is independently selected from the group consisting of a hydrogen atom, a halogen atom and a $C_1$ to $C_5$ alkyl group; $R_{21}$ is selected from the group consisting of a hydrogen atom, —$SO^{3-}$, a carboxyl group, a $C_1$ to $C_3$ alkyl group, a $C_1$ to $C_3$ alkoxyl group and —$NR_{17}R_{18}$; and $R_{22}$ is selected from the group consisting of a hydrogen atom and —$SO^{3-}$.

12. The method for forming patterns of claim 8, wherein the dye (C) further comprises a phthalocyanine dye (C-3).

13. The method for forming patterns of claim 12, wherein based on an amount of the novolac resin (A) as 100 parts by weight, an amount of the phthalocyanine dye (C-3) is 3 parts by weight to 60 parts by weight.

14. The method for forming patterns of claim 12, wherein the phthalocyanine dye (C-3) comprises a structure of the Formula (VI):

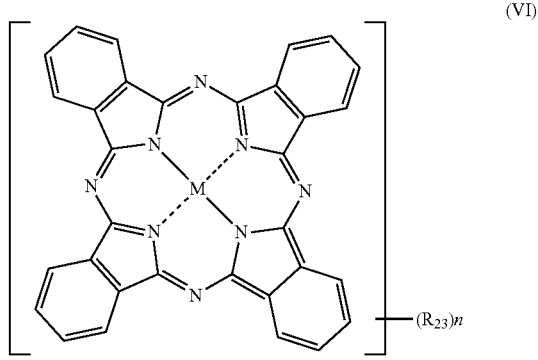

wherein $R_{23}$ is a substituted group independently selected from the group consisting of a hydrogen atom, a halogen atom, a cyano group, a nitro group, a formyl group, a carboxyl group, a sulfo group, an unsubstituted or substituted $C_1$ to $C_{20}$ alkyl group, an unsubstituted or substituted $C_6$ to $C_{24}$ aryl group, an unsubstituted or substituted $C_1$ to $C_{10}$ heterocyclic radical group, an unsubstituted or substituted $C_1$ to $C_{20}$ alkoxyl group, an unsubstituted or substituted $C_6$ to $C_{14}$ aryloxy group, an unsubstituted or substituted $C_2$ to $C_{21}$ acyl group, an unsubstituted or substituted $C_1$ to $C_{20}$ alkylsulfonyl group, an unsubstituted or substituted $C_6$ to $C_{14}$ arylsulfonyl group, an unsubstituted or substituted $C_1$ to $C_{10}$ heterocyclic sulfonyl group, an unsubstituted or substituted $C_1$ to $C_{25}$ carbamoyl group, an unsubstituted or substituted $C_0$ to $C_{32}$ sulfamoyl group, an unsubstituted or substituted $C_2$ to $C_{20}$ alkoxycarbonyl group, an unsubstituted or substituted $C_7$ to $C_{15}$ aryloxycarbonyl group, an unsubstituted or substituted $C_2$ to $C_{21}$ amide group, an unsubstituted or substituted $C_1$ to $C_{20}$ sulfonylamino group and an unsubstituted or substituted $C_0$ to $C_{36}$ amine group; n is a integer of 1 to 8; and M is selected from the group consisting of metals, metal chlorides, metal oxides and metal hydroxides.

15. A thin film transistor array substrate comprising a pattern formed by using the method of claim 8.

16. A liquid crystal display device comprising the thin film transistor array substrate of claim 15.

* * * * *